United States Patent
Wu et al.

(10) Patent No.: US 9,831,262 B2
(45) Date of Patent: Nov. 28, 2017

(54) EMBEDDED HKMG NON-VOLATILE MEMORY

(71) Applicant: Taiwan Semiconductor Manufacturing Co., Ltd., Hsin-Chu (TW)

(72) Inventors: Wei Cheng Wu, Zhubei (TW); Tzu-Yu Chen, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/984,095

(22) Filed: Dec. 30, 2015

(65) Prior Publication Data

US 2017/0194344 A1    Jul. 6, 2017

(51) Int. Cl.
| | |
|---|---|
| H01L 21/28 | (2006.01) |
| H01L 27/115 | (2017.01) |
| H01L 29/423 | (2006.01) |
| H01L 27/11582 | (2017.01) |
| H01L 27/1157 | (2017.01) |
| H01L 29/792 | (2006.01) |
| H01L 29/66 | (2006.01) |

(52) U.S. Cl.
CPC .. *H01L 27/11582* (2013.01); *H01L 21/28282* (2013.01); *H01L 27/1157* (2013.01); *H01L 29/42344* (2013.01); *H01L 29/6656* (2013.01); *H01L 29/66833* (2013.01); *H01L 29/792* (2013.01)

(58) Field of Classification Search
None
See application file for complete search history.

(56) References Cited

U.S. PATENT DOCUMENTS

| | | |
|---|---|---|
| 7,611,941 B1 | 11/2009 | Shum |
| 8,883,624 B1 | 11/2014 | Ramkumar |
| 2006/0261398 A1 | 11/2006 | Lee |
| 2008/0173944 A1 | 7/2008 | Coronel |
| 2013/0264652 A1* | 10/2013 | Zhu .................. H01L 21/28088 257/369 |
| 2014/0024183 A1 | 1/2014 | Hsu |

(Continued)

OTHER PUBLICATIONS

U.S. Appl. No. 14/984,034, filed Dec. 30, 2015.
U.S. Appl. No. 14/983,682, filed Dec. 30, 2015.
U.S. Appl. No. 14/983,686, filed Dec. 30, 2015.

(Continued)

*Primary Examiner* — Daniel Whalen
(74) *Attorney, Agent, or Firm* — Eschweiler & Potashnik, LLC (57) ABSTRACT

The present disclosure relates to an integrated circuit (IC) that includes a high-k metal gate (HKMG) non-volatile memory (NVM) device and that provides small scale and high performance, and a method of formation. In some embodiments, the integrated circuit includes a memory region having a select transistor and a control transistor laterally spaced apart over a substrate. A select gate electrode and a control gate electrode are disposed over a high-k gate dielectric layer and a memory gate oxide. A logic region is disposed adjacent to the memory region and has a logic device including a metal gate electrode disposed over the high-k gate dielectric layer and a logic gate oxide. The select gate electrode and the control gate electrode can be polysilicon electrodes.

20 Claims, 6 Drawing Sheets

(56) References Cited

U.S. PATENT DOCUMENTS

| | | | |
|---|---|---|---|
| 2014/0073126 A1* | 3/2014 | Shen | H01L 21/82345 |
| | | | 438/591 |
| 2014/0374814 A1* | 12/2014 | Wu | H01L 27/11568 |
| | | | 257/326 |
| 2015/0054049 A1 | 2/2015 | Perera | |
| 2015/0093864 A1 | 4/2015 | Perera | |
| 2015/0108475 A1 | 4/2015 | Ando et al. | |
| 2015/0236034 A1 | 8/2015 | Toh | |
| 2015/0249145 A1 | 9/2015 | Yoshimori | |
| 2015/0279854 A1 | 10/2015 | Hall | |
| 2015/0311221 A1 | 10/2015 | Huang | |
| 2016/0013313 A1 | 1/2016 | Cheng et al. | |
| 2016/0126327 A1 | 5/2016 | Chen | |

OTHER PUBLICATIONS

Final Office Action dated Apr. 4, 2017 in connection with U.S. Appl. No. 14/983,686.
Notice of Allowance dated Mar. 31, 2017 for U.S. Appl. No. 14/983,682.
Non Final Office Action dated Jan. 27, 2017 U.S. Appl. No. 14/984,095.
Non Final Office Action dated Nov. 3, 2016 U.S. Appl. No. 14/983,682.
Non Final Office Action dated Nov. 3, 2016 U.S. Appl. No. 14/983,686.
Notice of Allowance dated Jun. 5, 2017 in connection with U.S. Appl. No. 14/984,034.
Notice of Allowance dated Aug. 1, 2017 in connection with U.S. Appl. No. 14/983,686.

\* cited by examiner

EMBEDDED HKMG NON-VOLATILE MEMORY

BACKGROUND

Embedded memory is a technology that is used in the semiconductor industry to improve performance of an integrated circuit (IC). Embedded memory is a non-stand-alone memory, which is integrated on the same chip with a logic core and which supports the logic core to accomplish an intended function. High-performance embedded memory enables high-speed and wide bus-width capability, which limits or eliminates inter-chip communication.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In emerging technology nodes, the semiconductor industry has begun to integrate logic devices and memory devices on a single semiconductor chip. This integration improves performance over solutions where two separate chips—one for memory and another for logic—cause undesirable delays due to wires or leads that connect the two chips. In addition, the processing costs for integrating memory and logic devices on the same semiconductor chip are reduced due to the sharing of specific process steps used to fabricate both types of devices. One common type of embedded memory is embedded flash memory, which may include an array of two transistors (2T) memory cells. A 2T memory cell comprises a control transistor and a select transistor laterally spaced over the semiconductor substrate. A control gate of the control transistor is separated from the substrate by a charge trapping dielectric layer.

High-k metal gate (HKMG) technology has also become one of the front-runners for the next generation of CMOS devices. HKMG technology incorporates a high-k dielectric to increase transistor capacitance and reduce gate leakage. A metal gate electrode is used to help with Fermi-level pinning and to allow the gate to be adjusted to low threshold voltages. By combining the metal gate electrode and the high-k dielectric, HKMG technology makes further scaling possible and allows integrated chips to function with reduced power.

The present disclosure relates to an integrated circuit (IC) that comprises a small scale and high performance high-k metal gate (HKMG) non-volatile memory (NVM) device, and a method of formation. In some embodiments, the integrated circuit comprises a memory region and an adjacent logic region disposed over a substrate. The logic region comprises a logic device including a metal gate electrode disposed over a high-k gate dielectric layer and a logic gate oxide, and the memory region comprises a non-volatile memory (NVM) device including a select transistor and a control transistor separated from the substrate by the high-k gate dielectric layer and a memory gate oxide and laterally spaced apart one from another. The select transistor comprises a select gate electrode, and the control transistor comprises a control gate electrode separated from the substrate by a charge trapping layer. The select gate electrode and the control gate electrode comprise polysilicon. By integrating of the HKMG logic region and the 2T memory region, manufacturing processes are simplified such that further scaling becomes possible in emerging technology nodes (e.g., 28 nm and below).

Figure 1:
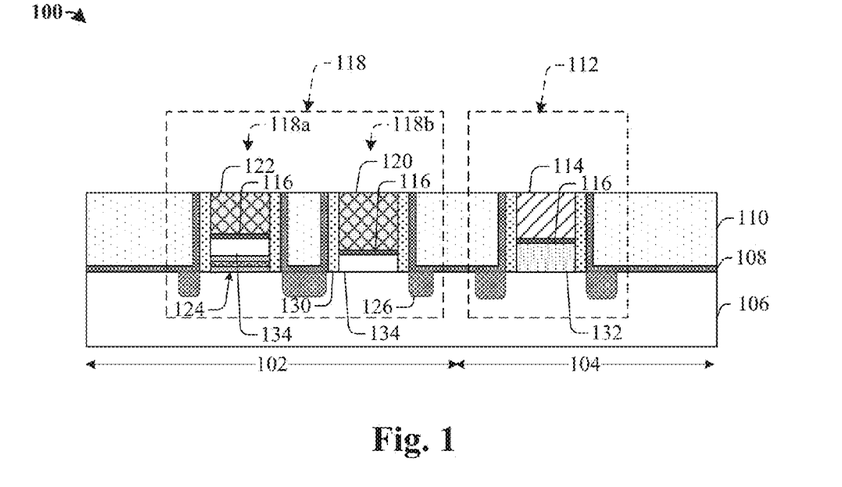
FIG. 1 illustrates a cross-sectional view of some embodiments of an integrated circuit (IC) comprising a high-k metal gate (HKMG) non-volatile memory (NVM) device.

FIG. 1 illustrates a cross-sectional view of some embodiments of an IC 100 comprising a HKMG NVM device (e.g., a HKMG 2T NVM device, or a hybrid 2T NVM device). The IC 100 comprises a memory region 102 and a logic region 104 disposed adjacent to the memory region 102. The logic region 104 comprises a logic device 112 disposed over a substrate 106. The logic device 112 comprises a metal gate electrode 114 disposed over a high-k gate dielectric layer 116. By having HKMG structure in the logic device 112, transistor capacitance (and thereby drive current) is increased and gate leakage and threshold voltage are reduced. In some embodiments, the metal gate electrode 114 may be further separated from the substrate 106 by a logic gate oxide 132.

The memory region 102 comprises a non-volatile memory (NVM) device 118 including a control transistor 118a and a select transistor 118b spaced apart one from another. A select gate electrode 120 of the select transistor 118b and a control gate electrode 122 of the control transistor 118a are also disposed over the high-k gate dielectric layer 116. The select gate electrode 120 and the control gate electrode 122 comprise a different material than the metal gate electrode 114. For example, in some embodiments, the select gate electrode 120 and the control gate electrode 122 may comprise polysilicon. Source/drain regions 126 are arranged alongside the select gate electrode 120 and the control gate electrode 122.

The control gate electrode 122 is separated from the substrate 106 by a charge trapping layer 124. In some embodiments a memory gate oxide 134 is disposed below the select gate electrode 120 and the control gate electrode 122 and further separates the select gate electrode 120 and the control gate electrode 122 from the substrate 106. In some embodiments, the select gate electrode 120 and the control gate electrode 122 may have cuboid shapes, which have upper surfaces aligned with an upper surface of the metal gate electrode 114. In some embodiments, the select gate electrode 120 may be connected to a word line, which is configured to control access of the NVM device 118.

During operation, charges (e.g. electrons) can be injected to/from the charge trapping layer 124 to program/erase the NVM device 118. The high-k gate dielectric layer 116 reduces tunneling gate leakage, and allows a low voltage to be applied to the select gate electrode 120 to form an inversion channel below the select gate electrode 120. The low select gate voltage helps to minimize drain current and leads to a relatively small programming power. A high voltage is applied to the control gate electrode 122 which attracts or repels electrons to or from the charge trapping layer 124, yielding a high injection or removal efficiency.

In some embodiments, the IC 100 further comprises a sidewall spacer 130 disposed along sidewalls of the metal gate electrode 114, the select gate electrode 120 and the control gate electrode 122. In some embodiments, the sidewall spacer 130 can be made of silicon nitride or silicon oxide. The sidewall spacers 130 have upper surfaces that are aligned with upper surfaces of the metal gate electrode 114, the select gate electrode 120 and the control gate electrode 122. The sidewall spacers 130 may contact an upper surface of the substrate 106.

The logic region 104 and the memory region 102 may be laterally separated from one another by an inter-layer dielectric layer 110 arranged over the substrate 106. In some embodiments, a contact etch stop layer 108 separates the inter-layer dielectric layer 110 from the logic device 112, the NVM device 118 and the substrate 106. The contact etch stop layer 108 may line the logic device 112 and the NVM device 118 and have a substantially planar lateral component that extends between the logic region 104 and the memory region 102. Using the inter-layer dielectric layer 110 and the contact etch stop layer 108 to isolate the logic device 112 and the NVM device 118 allows for high device density to be achieved.

Figure 2:
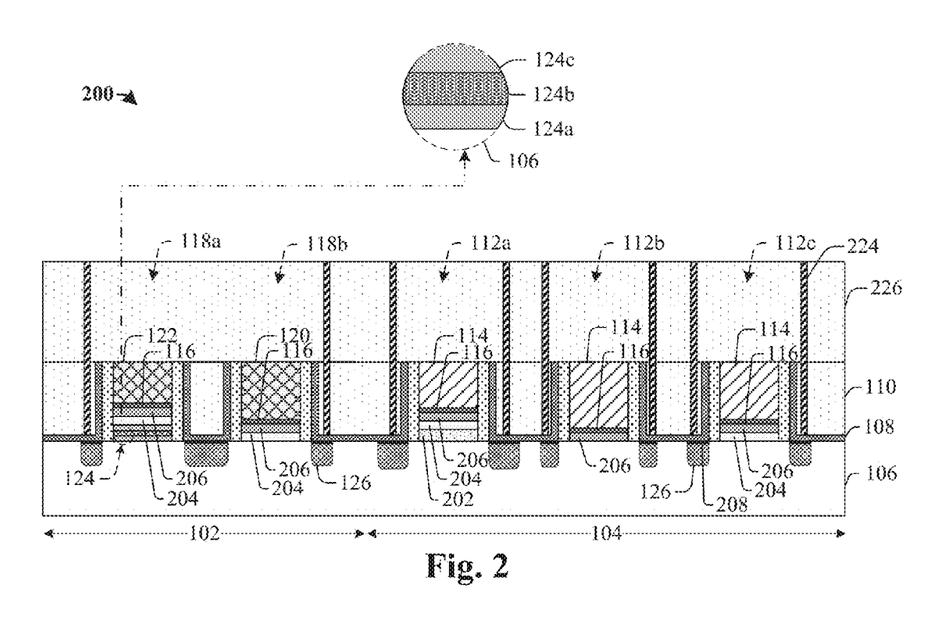
FIG. 2 illustrates a cross-sectional view of some additional embodiments of an IC comprising a HKMG NVM device.

FIG. 2 illustrates a cross-sectional view of some additional embodiments of an IC 200 comprising a HKMG NVM device, or a hybrid NVM device. The IC 200 comprises a memory region 102 having a NVM device 118 and a logic region 104 having a logic device 112. A plurality of source/drain regions 126 are disposed within a substrate 106 in the logic region 104 and the memory region 102. A silicide layer 208 is arranged onto the source/drain regions 126. In some embodiments, the silicide layer 208 comprises a nickel silicide. A metal gate electrode 114 is disposed over the substrate 106 within the logic region 104 at a location between source/drain regions 126, and is separated from the substrate 106 by a high-k gate dielectric layer 116. In some embodiments, the memory region 102 comprises a control transistor 118a and a select transistor 118b including a control gate electrode 122 and a select gate electrode 120 disposed spaced apart over the substrate 106 on the high-k gate dielectric layer 116 within the memory region 102. The control gate electrode 122 and the select gate electrode 120 may comprise polysilicon.

The logic region 104 may comprise one or more logic devices, such as a high voltage device 112a (e.g. CMOS transistors for memory programing/erasing), a core device 112b (e.g. CMOS logic gates for processing memory data), and an I/O (input/output) device 112c configured to receive and transmit signals. The high voltage device 112a may be operated at a bias voltage higher than an operation voltage of the core device 112b, thereby having higher operation power and higher breakdown voltage than the core device 112b. Furthermore, the I/O device 112c may also be operated at a bias voltage higher than the bias voltage of the core device 112b, thereby making the I/O device 112c capable of heavy current driving. Because of the different operating voltages the devices may have gate electrodes overlying different gate dielectric thicknesses (e.g., the high voltage device 112a has one or more underlying oxide(s) with a collective greater thickness than the core device 112b and the I/O device 112c).

For example, in some embodiments, a gate dielectric of the high voltage device 112a comprises a first oxide layer 202, a second oxide layer 204 and a third oxide layer 206 stacked in that order. A gate dielectric of the core device 112b may comprise the third oxide layer while the first and second oxide layers 202, 204 are absent, thus forming a thinner gate dielectric and achieving lower power consumption. A gate dielectric of the I/O device 112c may comprise the second and third oxide layers 204, 206 while the first oxide layer 202 is absent. In some embodiments, the control transistor 118a and the select transistor 118b within the memory region 102 may have the same gate dielectric components with the I/O device 112c (i.e., the second and third oxide layers 204, 206), for simplifying manufacturing complexity. The logic devices 112a-112c may also respectively comprise the metal gate electrodes 114 and high-k gate dielectric layers 116 disposed on corresponding gate dielectrics.

The control transistor 118a further comprises a charge trapping layer 124 disposed below its gate dielectric. In some embodiments, the charge trapping layer 124 may comprise a tri-layer structure. For example, in some embodiments, the tri-layer structure may comprise an ONO structure having a first dielectric layer 124a (e.g. a silicon dioxide layer), a nitride layer 124b (e.g. a silicon nitride layer) contacting the first dielectric layer 124a, and a second dielectric layer 124c (e.g. a silicon dioxide layer) contacting the nitride layer 124b. In other embodiments, the tri-layer structure may comprise an oxide-nano-crystal-oxide (ONCO) structure having a first oxide layer, a layer of crystal nano-dots (e.g. silicon dots) contacting the first oxide layer, and a second oxide layer contacting the first oxide layer and the layer of crystal nano-dots. In some embodiments, the metal gate electrode 114 may comprise titanium (Ti), tantalum (Ta), tungsten (W), aluminum (Al) or zirconium (Zr), for example. In some embodiments, the high-k gate dielectric layer 116 may comprise hafnium oxide (HfO), hafnium silicon oxide (HfSiO), hafnium aluminum oxide (HfAlO), or hafnium tantalum oxide (HfTaO), for example.

In some embodiments, a contact etch stop layer 108 lines sidewalls of a sidewall spacer 130 and continuously extends along an upper surface of the substrate 106 and the silicide layer 208 between the memory region 102 and the logic region 104. In some embodiments, the contact etch stop layer 108 has a 'U' shaped structure with a planar lateral component connecting a first vertical component abutting the sidewall spacer 130 arranged along a side of the NVM device 118 and a second vertical component abutting the sidewall spacer 130 arranged along a side of the logic device 112. In some embodiments, the contact etch stop layer 108 also has a 'U' shaped structure between the select transistor 118b and the control transistor 118a.

A first inter-layer dielectric layer 110 is disposed within recesses of the contact etch stop layer 108. In some embodiments, the first inter-layer dielectric layer 110 has an upper surface aligned with upper surfaces of the select gate electrode 120, the control gate electrode 122, and the metal gate electrode 114. In some embodiments, a second inter-layer dielectric layer 226 can be disposed over the NVM device 118 and the logic device 112. In some embodiments, the first inter-layer dielectric layer 110 and the second inter-layer dielectric layer 226 may comprise a low-k dielectric layer, an ultra low-k dielectric layer, an extreme low-k dielectric layer, and/or a silicon dioxide layer. A plurality of contacts 224 comprising a conductive material extend vertically through the second inter-layer dielectric layer 226. In some embodiments, one or more of the plurality of contacts may also extend through the first inter-layer dielectric layer 110 and the contact etch stop layer 108 and be coupled to the source/drain regions 126. In some embodiments, the plurality of contacts 224 may comprise a metal such as tungsten, copper, and/or aluminum.

Though not shown in above figures, logic devices (e.g. 112a, 112b, 112c) of the logic region 104 may comprise metal gates with different compositions and thicknesses. For example, the logic region 104 may comprise an NMOS transistor device having an NMOS metal gate and a PMOS transistor device having a PMOS metal gate. The NMOS metal gate has a different composition and a different work function than the PMOS metal gate. In some embodiments, the metal gates may have upper surfaces aligned one from another.

FIGS. 3-14 illustrate a series of cross-sectional views 300-1400 of some embodiments of a method for manufacturing an IC comprising a HKMG NVM device.

Figure 3:
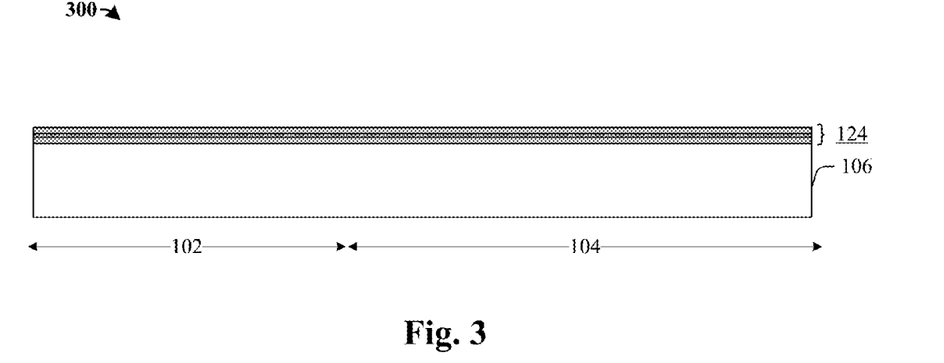
FIGS. 3-14 illustrate a series of cross-sectional views of some embodiments of a method for manufacturing an IC comprising a HKMG NVM device.

As shown in cross-sectional view 300 of FIG. 3, a charge trapping layer 124 is formed over a substrate 106. The substrate 106 may comprise a logic region 104 and a memory region 102. In various embodiments, the substrate 106 may comprise any type of semiconductor body (e.g., silicon bulk, SiGe, SOI, etc.) such as a semiconductor wafer or one or more die on a wafer, as well as any other type of semiconductor and/or epitaxial layers formed thereon and/or otherwise associated therewith. In some embodiments, the charge trapping layer 124 is formed by using a deposition technique (e.g., PVD, CVD, PE-CVD, ALD, etc.) to form a tri-layer structure comprising an ONO structure having a first oxide layer (e.g. a silicon dioxide layer), a nitride layer (e.g. a silicon nitride layer) contacting the first oxide layer, and a second oxide layer contacting the nitride layer.

Figure 4:
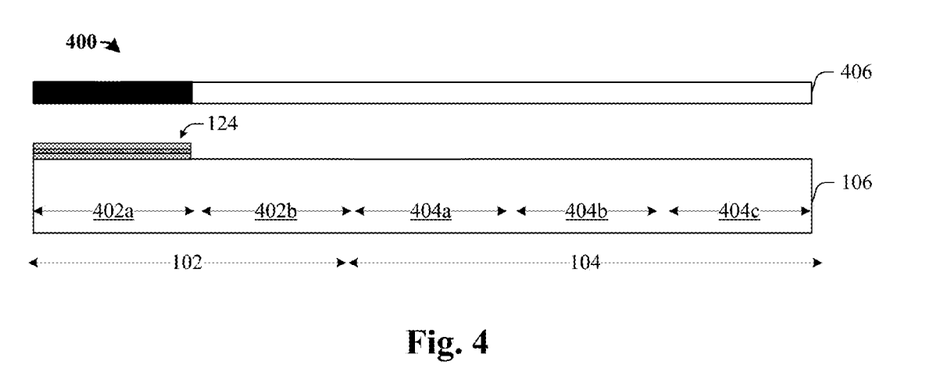

As shown in cross-sectional view 400 of FIG. 4, the charge trapping layer 124 is patterned so that it remains within a control transistor region 402a of the memory region 102 and so that it is removed from remaining areas of the memory region 102 and the logic region 104. In some embodiments, the charge trapping layer 124 is removed by performing a photolithography process (e.g., using a mask 406) that patterns a photosensitive masking layer (e.g., photoresist) that protects the charge trapping layer 124 within the control transistor region 402a from removal by one or more subsequent etching processes. In various embodiments, the etching processes may comprise a wet etch and/or a dry etch (e.g., a plasma etch with tetrafluoromethane ($CF_4$), sulfur hexafluoride ($SF_6$), nitrogen trifluoride ($NF_3$), etc.).

Figure 5:
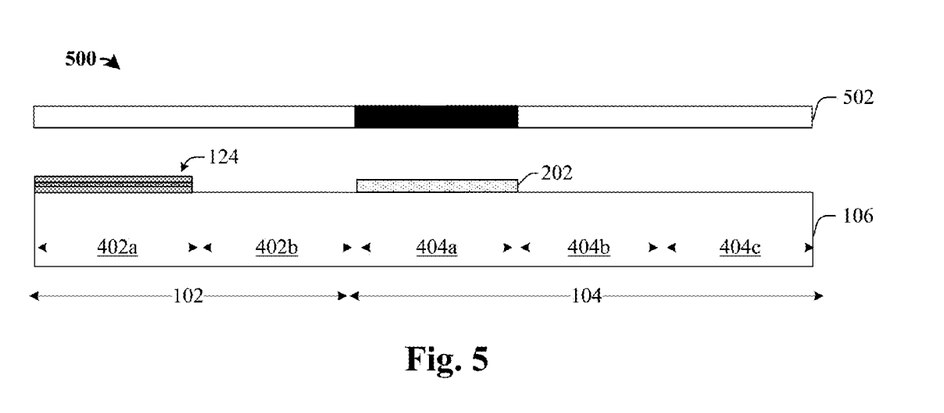

As shown in cross-sectional view 500 of FIG. 5, a first oxide layer 202 is formed and patterned so that it remains within a high voltage device region 404a of the logic region 104 and so that it is removed from remaining areas of the logic region 104 (e.g., core device region 404b and I/O device region 404c) and the memory region 102 (e.g., control transistor region 402a and select transistor region 402b). In some embodiments, the first oxide layer 202 is formed by using a deposition technique (e.g., PVD, CVD, PE-CVD, ALD, etc.) and removed by performing a photolithography process (e.g., using a mask 502) and an etching process.

Figure 6:
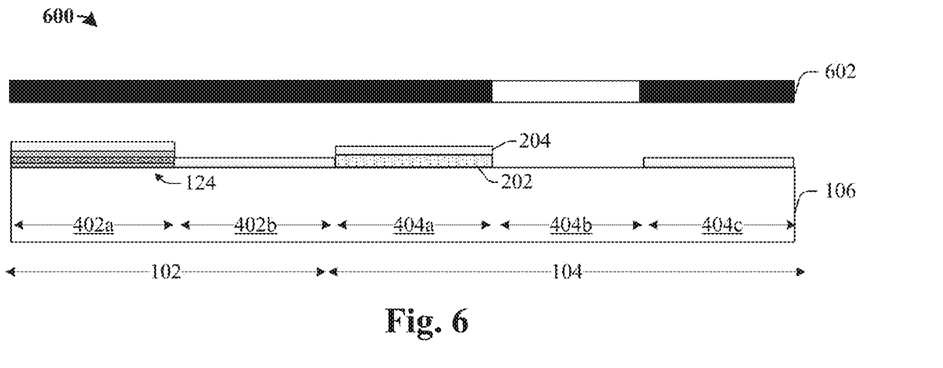

As shown in cross-sectional view 600 of FIG. 6, a second oxide layer 204 is formed and patterned so that it is removed from a core device region 404b of the logic region 104 and so that it remains within other areas of the logic region 104 and the memory region 102. In some embodiments, the second oxide layer 204 is formed by using a deposition technique (e.g., PVD, CVD, PE-CVD, ALD, etc.) and is removed by performing a photolithography process (e.g., using a mask 602) and an etching process. In some embodiments, an excessive portion of the first oxide layer 202 within the core device region 404b can be patterned and removed together with the patterning of the second oxide layer 204 (i.e., so that the first oxide layer 202 is removed from the core device region 404b by a subsequent etch that is separate from an etch used to remove the first oxide layer from other areas of the logic region 104 and the memory region 102).

Figure 7:
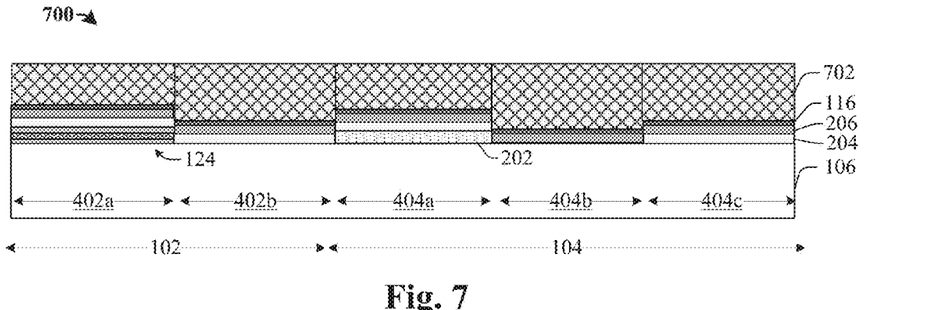

As shown in cross-sectional view 700 of FIG. 7, a third oxide layer 206, a high-k gate dielectric layer 116 and a sacrificial gate layer 702 are subsequently formed. A planarization process can be performed on the sacrificial gate layer 702.

Figure 8:
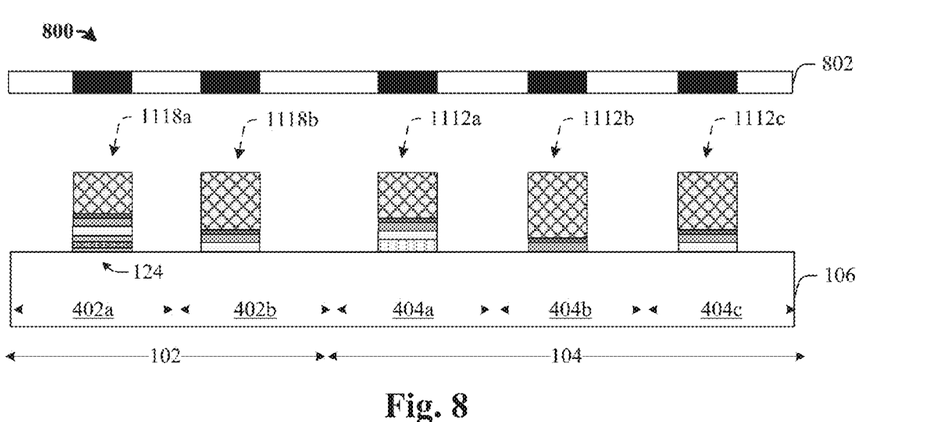

As shown in cross-sectional view 800 of FIG. 8, the sacrificial gate layer 702, the high-k gate dielectric layer 116 and the oxide layers 206, 204, 202 are patterned to form a control gate stack 1118a and a select gate stack 1118b within the memory region 102 and a high voltage gate stack 1112a, a core gate stack 1112b and an I/O gate stack 1112c within the logic region 104. In some embodiments, a sacrificial oxide or nitride hard mask layer (not shown) is formed over the gate stacks. In some embodiments, sacrificial gate layer 702 may comprise polysilicon formed by a deposition process (e.g., CVD, PVD, ALD, etc.). In some embodiments, the gate stacks are formed by performing a photolithography process (e.g., using a mask 802) that patterns a photosensitive masking layer (e.g., photoresist), which protects masked areas from removal by one or more subsequent etching processes. In various embodiments, the etching processes may comprise a wet etch or a dry etch (e.g., a plasma etch with tetrafluoromethane ($CF_4$), sulfur hexafluoride ($SF_6$), nitrogen trifluoride ($NF_3$), etc.).

Figure 9:
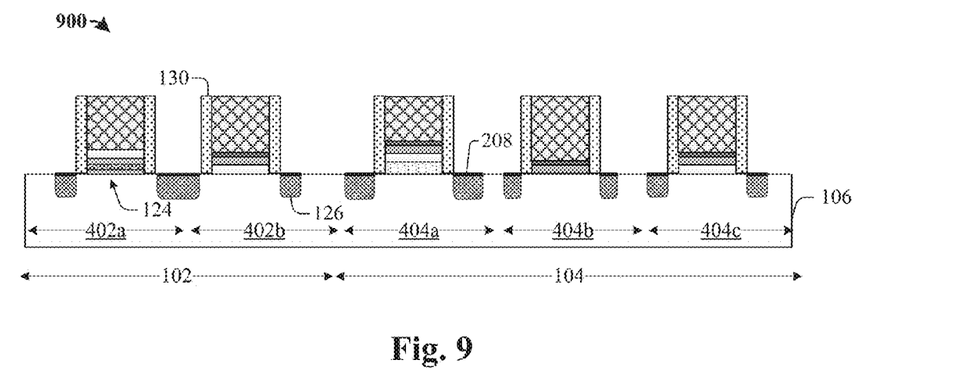

As shown in cross-sectional view 900 of FIG. 9, a sidewall spacer 130 is formed along the gate stacks 1118a-b, 1112a-c. In some embodiments, the sidewall spacer 130 may comprise an oxide (e.g., $SiO_2$) or a nitride (e.g., SiN) formed by a deposition process. The sidewall spacer 130 may be formed directly on an upper surface of the substrate 106. Source/drain regions 126 are subsequently formed within the memory region 102 and within the logic region 104, respectively. In some embodiments, the source/drain regions 126 may be formed by an implantation process that selectively implants the substrate 106 with a dopant, such as boron (B) or phosphorous (P), for example. In some other embodiments, the source/drain regions 126 may be formed by performing an etch process to form a trench followed by an epitaxial growth process to form the source/drain regions 126 within the trench. In such embodiments, the source/drain regions 126 may have a raised portion that is higher than the upper surface of the substrate 106. In some embodiments, a salicidation process is performed to form a silicide layer 208 on upper surfaces of the source/drain regions 126. In some embodiments, the salicidation process may be performed by depositing a nickel layer and then performing a thermal annealing process (e.g., a rapid thermal anneal).

Figure 10:
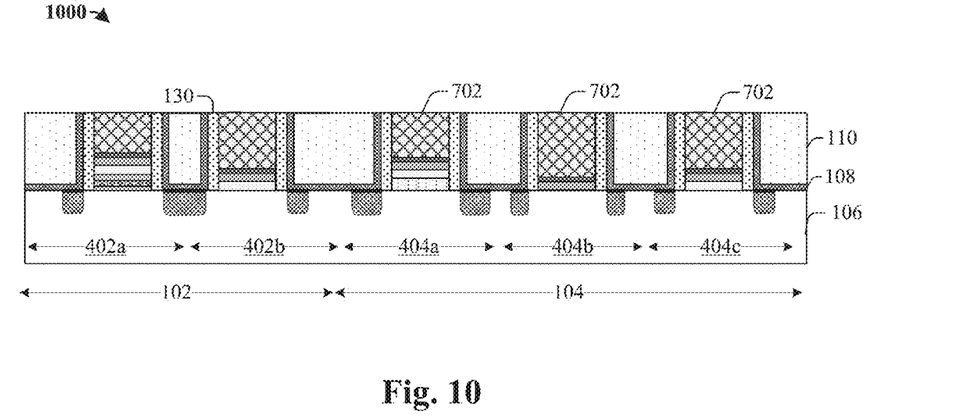

As shown in cross-sectional view 1000 of FIG. 10, a conformal contact etch stop layer 108 is formed over the source/drain regions 126 and extends along the sidewall spacer 130. In some embodiments, the contact etch stop layer 108 may comprise silicon nitride formed by way of a deposition process (e.g., CVD, PVD, etc.). A first inter-layer dielectric layer 110 is then formed over the contact etch stop layer 108 followed by performing a first planarization process. In some embodiments, the first planarization process may comprise a chemical mechanical polishing (CMP) process. In some embodiments, the first inter-layer dielectric layer 110 may comprise a low-k dielectric layer, formed by way of a deposition process (e.g., CVD, PVD, etc.). The sacrificial gate layer 702 is exposed after the first planarization process. FIGS. 11-14 show some embodiments of a subsequent replacement gate process.

Figure 11:
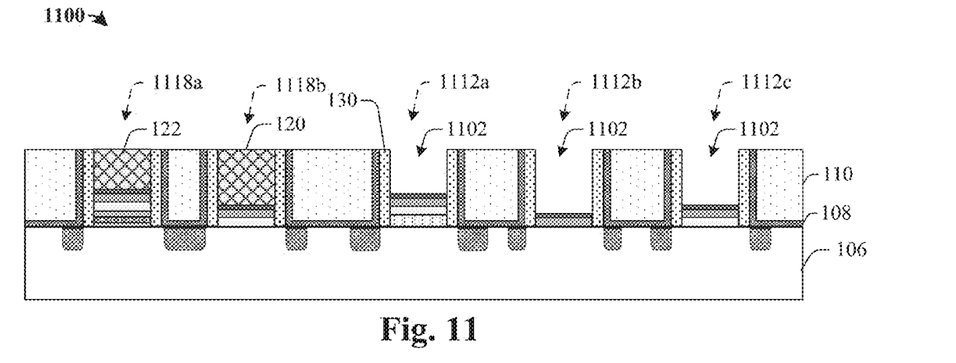

As shown in cross-sectional view 1100 of FIG. 11, the sacrificial gate layer 702 (shown in FIG. 10) is removed from the high voltage gate stack 1112a, the core gate stack 1112b and the I/O gate stack 1112c, resulting in the formation of trenches 1102 between the sidewall spacers 130. The sacrificial gate layer 702 (shown in FIG. 10) may remain in the control gate stack 1118a and the select gate stack 1118b, leaving a control gate electrode 122 and a select gate electrode 120 in place.

Figure 12:
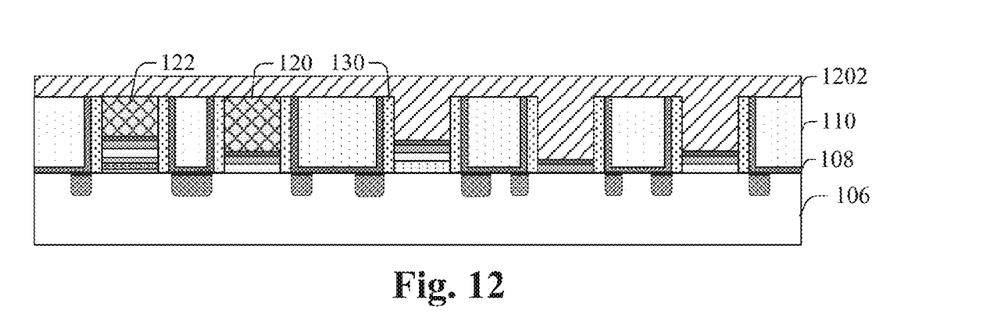

As shown in cross-sectional view 1200 of FIG. 12, a metal gate material 1202 are formed over the first inter-layer dielectric layer 110 and filled into the trenches 1102 of FIG. 11 through one or more deposition processes (e.g., chemical vapor deposition, physical vapor deposition, etc.). Though shown as depositing a single metal layer, it is appreciated that the replacement gate process may comprise a series of deposition and etching processes that form different metal compositions within trenches for different logic devices, or different components of the same logic devices. In this way, desired work functions can be achieved.

Figure 13:
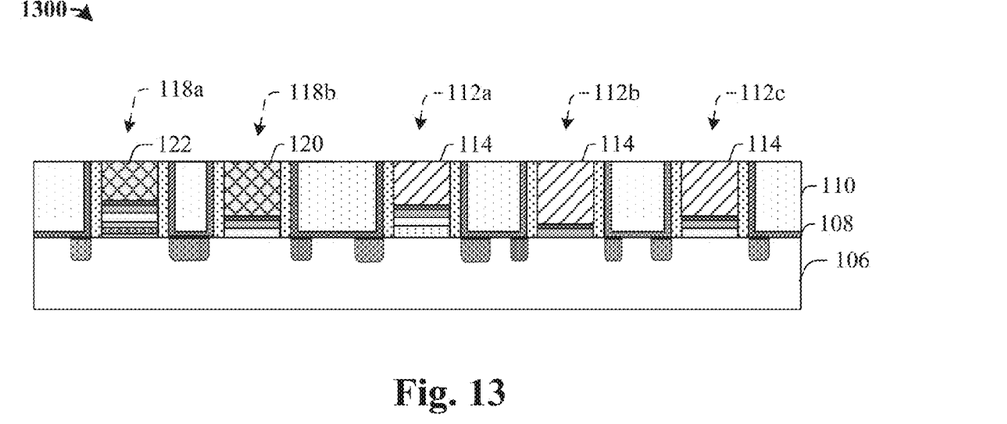

As shown in cross-sectional view 1300 of FIG. 13, a second planarization process may be performed following the deposition processes to form a high voltage device 112a, a core device 112b and an I/O device 112c within the logic region 104, which comprise metal gate electrodes 114 (e.g. from the metal gate material 1202 shown in FIG. 12). In some embodiments, the control transistor 118a and the select transistor 118b are formed within the memory region 102, which comprise select gate electrode 120 and the control gate electrode 122 (e.g. from the sacrificial gate layer 702 shown in FIG. 7) that comprise a different material than the metal gate electrodes 114.

Figure 14:
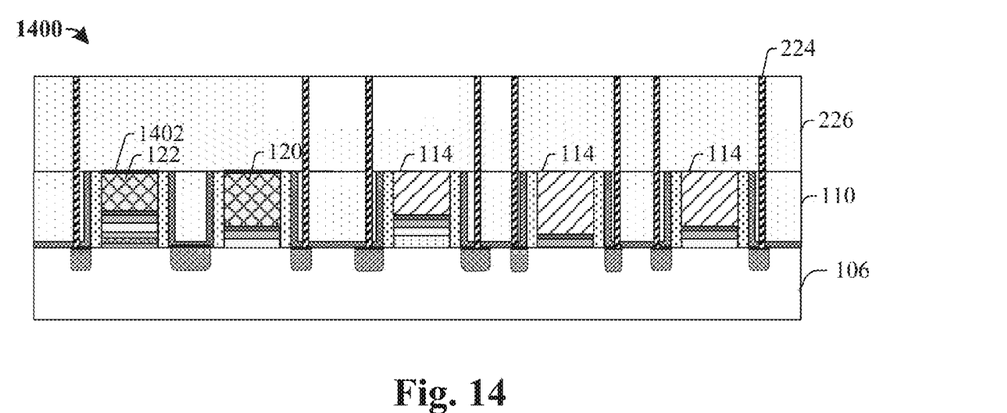

As shown in cross-sectional view 1400 of FIG. 14, contacts 224 are formed within a second inter-layer dielectric layer 226 overlying the first inter-layer dielectric layer 110. The contacts 224 may be formed by selectively etching the second inter-layer dielectric layer 226 to form openings, and by subsequently depositing a conductive material within the openings. In some embodiments, the conductive material may comprise tungsten (W) or titanium nitride (TiN), for example. In some embodiments, a salicidation process may be performed to form a silicide layer 1402 on upper surfaces of the select gate stack 118b (shown in FIG. 13) and the control gate stack 118a (shown in FIG. 13) after replacing the sacrificial gate layer 702 (shown in FIG. 10, e.g. a polysilicon layer) with the metal gate material 1202 (shown in FIG. 12).

Figure 15:
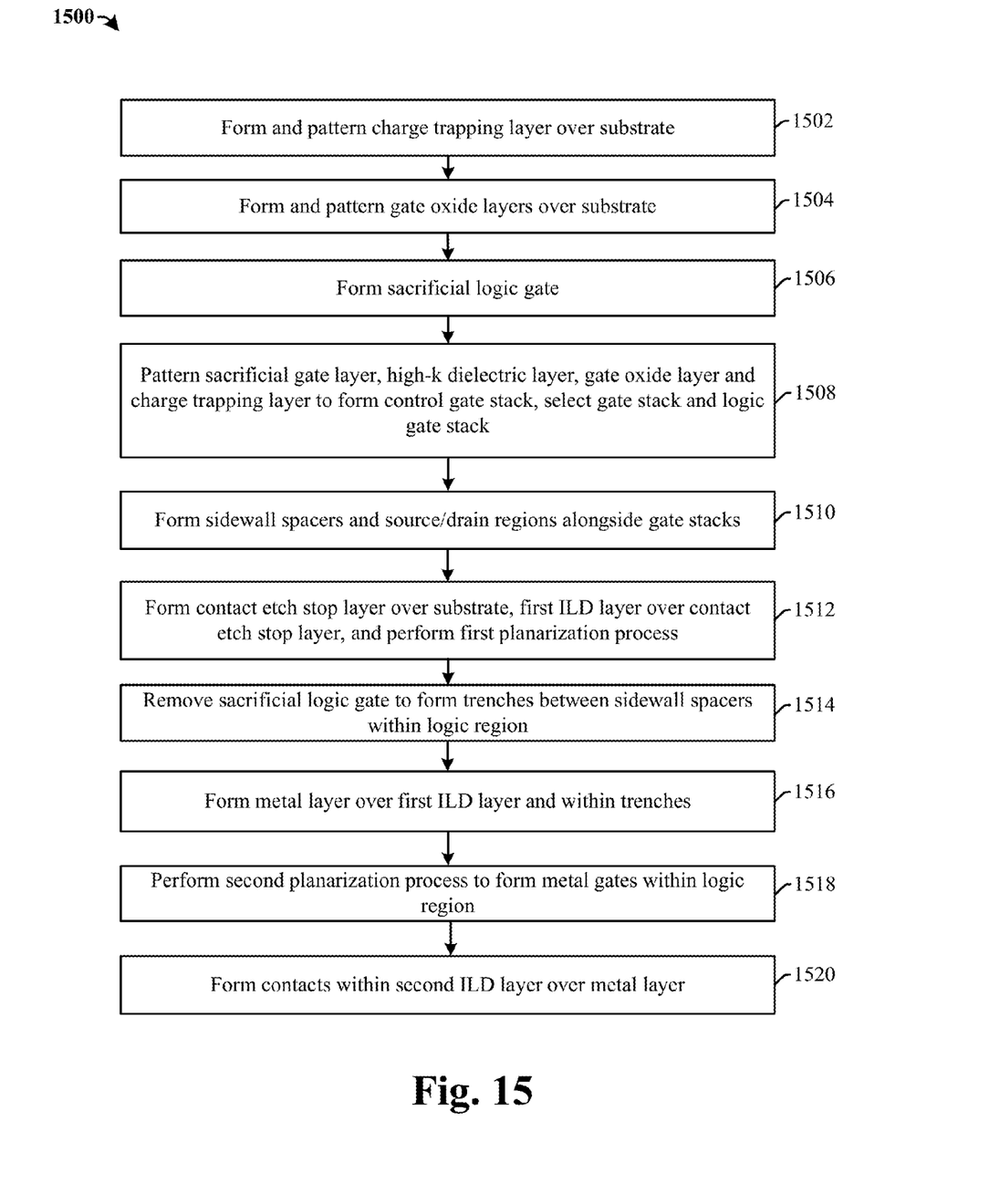
FIG. 15 illustrates a flow diagram of some embodiments of a method for manufacturing an IC comprising a HKMG NVM device.

FIG. 15 illustrates a flow diagram of some embodiments of a method 1500 for manufacturing an IC comprising a HKMG NVM device.

Although method 1500 is described in relation to FIGS. 3-14, it will be appreciated that the method 1500 is not limited to such structures, but instead may stand alone as a method independent of the structures. Furthermore, while the disclosed methods (e.g., method 1500) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1502, a charge trapping layer is formed and patterned within a control transistor region of a memory region over a substrate. FIGS. 3-4 illustrate some embodiments of cross-sectional views 300 and 400 corresponding to act 1502.

At 1504, gate dielectrics are formed and patterned over the substrate. In some embodiments, the gate dielectric for the memory region is formed of a different thickness from a high voltage device region and/or a core device region of a logic region. FIGS. 5-6 illustrate some embodiments of cross-sectional views 500 and 600 corresponding to act 1504.

At 1506, a high-k gate dielectric layer and a sacrificial gate layer are formed subsequently over the gate dielectrics. The sacrificial gate layer may comprise polysilicon. A planarization process can be performed on the sacrificial gate layer. FIG. 7 illustrates some embodiments of a cross-sectional view 700 corresponding to act 1506.

At 1508, the sacrificial gate layer, the high-k gate dielectric layer and the oxide layers are patterned to form a control gate stack and a select gate stack within the memory region and a high voltage gate stack, a core gate stack and an I/O gate stack within the logic region. FIG. 8 illustrates some embodiments of a cross-sectional view 800 corresponding to act 1508.

At 1510, a sidewall spacer is formed along sidewall of the gate stacks. The source/drain regions are formed within the substrate. FIG. 9 illustrates some embodiments of a cross-sectional view 900 corresponding to act 1510.

At 1512, a contact etch stop layer is formed over the substrate, a first inter-level dielectric layer is formed over the contact etch stop layer, and a first planarization is performed. The sacrificial gates within the logic region and the memory region are exposed. FIG. 10 illustrates some embodiments of a cross-sectional view 1000 corresponding to act 1512.

At 1514, a sacrificial logic gate is removed from the gate stacks, forming trenches between the sidewall spacer within the logic region. The sacrificial logic gate remains within the memory region, forming a select gate electrode and a control gate electrode comprising a same material as the sacrificial logic gate. FIG. 11 illustrates some embodiments of a cross-sectional view 1100 corresponding to act 1514.

At 1516, a replacement gate process is subsequently performed by forming a metal layer over the first inter-level dielectric layer and filling the trenches. FIG. 12 illustrates some embodiments of a cross-sectional view 1200 corresponding to act 1516.

At 1518, a second planarization is performed and metal gate electrodes are formed within the logic region. FIG. 13 illustrates some embodiments of a cross-sectional view 1300 corresponding to act 1518.

At 1520, a second inter-level dielectric layer and contacts are formed over the first inter-level dielectric layer. The second inter-level dielectric layer overlies the metal gate electrodes within the logic region, and the select gate electrode and the control gate electrode within the memory region. FIG. 14 illustrates some embodiments of a cross-sectional view 1400 corresponding to act 1520.

Therefore, the present disclosure relates to an integrated circuit (IC) that comprises a high-k metal gate (HKMG) hybrid non-volatile memory (NVM) device and that provides small scale and high performance, and a method of formation.

In some embodiments, the present disclosure relates to an integrated circuit. The integrated circuit comprises a memory region comprising a select transistor and a control transistor laterally spaced apart over a substrate. The select transistor and the control transistor respectively comprise a select gate electrode and a control gate electrode disposed over a high-k gate dielectric layer and a memory gate oxide. The integrated circuit further comprises a logic region disposed adjacent to the memory region and comprising a logic device including a metal gate electrode disposed over the high-k gate dielectric layer and a logic gate oxide. The select gate electrode and the control gate electrode comprise polysilicon.

In other embodiments, the present disclosure relates to present disclosure relates to a method of forming an integrated circuit. The method comprises providing a substrate comprising a logic region having a logic device and a memory region including a select transistor region having a select transistor and an adjacent control transistor region having a control transistor. The method further comprises forming a charge trapping layer over the substrate within the control transistor region and forming oxide layers, a high-k gate dielectric layer and a polysilicon layer over the substrate. The method further comprises patterning the polysilicon layer, the high-k gate dielectric layer and the oxide layers to form a logic sacrificial gate stack within the logic region, a select gate stack within the select transistor region and a control gate stack within the control transistor region and replacing the polysilicon layer within the logic sacrificial gate stack with a metal layer to form a metal gate electrode within the logic region.

In yet other embodiments, the present disclosure relates to present disclosure relates to a method of forming an integrated circuit. The method comprises providing a substrate comprising a logic region having a logic device and a memory region having a NVM device. The logic device including a high voltage device, a core device and an I/O (input/output) device and the NVM device including a select transistor and a control transistor spaced apart one from another. The method further comprises forming oxide layers, a high-k gate dielectric layer and a polysilicon layer over the substrate, wherein the oxide layers collectively form a gate dielectric having a first thickness for the high voltage device, a second thickness for the core device and a third thickness for the I/O device, such that the first, second and third thicknesses are different. The method further comprises patterning the polysilicon layer, the high-k gate dielectric layer and the oxide layers to form a high voltage sacrificial gate stack, a core sacrificial gate stack and an I/O sacrificial gate stack within the logic region, and form a select gate stack and a control gate stack within the memory region. The method further comprises replacing the polysilicon layer within the logic region with a metal layer to form metal gate electrodes for the high voltage device, the core device and the I/O device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit (IC), comprising:
   providing a substrate comprising a logic region and a memory region including a select transistor region and an adjacent control transistor region;
   forming a charge trapping layer over the substrate within the control transistor region;
   forming oxide layers, a high-k gate dielectric layer and a polysilicon layer over the substrate;
   patterning the polysilicon layer, the high-k gate dielectric layer and the oxide layers to form a logic sacrificial gate stack within the logic region, a select gate stack within the select transistor region and a control gate stack within the control transistor region; and
   replacing the polysilicon layer within the logic sacrificial gate stack with a metal layer to form a metal gate electrode within the logic region;
   wherein forming the oxide layers comprises:
     forming and patterning a first oxide layer so that it remains within a first area of the logic region and so that it is removed from remaining areas of the logic region and the memory region; and
     forming and patterning a second oxide layer so that it is removed from a second area of the logic region and so that it remains within remaining areas of the logic region and the memory region.

2. The method of claim 1, further comprising:
   forming sidewall spacers alongside the logic sacrificial gate stack, the select gate stack and the control gate stack;
   forming a contact etch stop layer lining the sidewall spacers;
   forming an inter-layer dielectric layer on the contact etch stop layer; and
   performing a planarization on the inter-layer dielectric layer to expose the sidewall spacers and the polysilicon layer.

3. The method of claim 2, further comprising:
   performing an etch to remove the polysilicon layer, leaving trenches between the sidewall spacers; and filling the metal layer within the trenches to form the metal gate electrode within the logic region.

4. The method of claim 2, wherein sidewalls of the select gate stack and the control gate stack are respectively covered by the sidewall spacers and spaced apart laterally by the contact etch stop layer and the inter-layer dielectric layer.

5. The method of claim 2, wherein the memory region and the logic region are separated by a 'U' shaped structure of the contact etch stop layer and the inter-layer dielectric layer disposed thereon, having upper surfaces aligned with an upper surface of the metal gate electrode.

6. The method of claim 1, wherein the polysilicon layer remains in the select transistor region and the control transistor region when removed from the logic sacrificial gate stack.

7. A method of forming an integrated circuit (IC) comprising:
providing a substrate comprising a logic region and a memory region, the logic region including a high voltage device region, a core device region and an I/O (input/output) device region and the memory region including a select transistor region and a control transistor region spaced apart one from another;
forming oxide layers, a high-k gate dielectric layer and a polysilicon layer over the substrate, wherein the oxide layers collectively form a gate dielectric having a first thickness for the high voltage device region, a second thickness for the core device region and a third thickness for the I/O device region, such that the first, second and third thicknesses are different;
patterning the polysilicon layer, the high-k gate dielectric layer and the oxide layers to form a high voltage sacrificial gate stack, a core sacrificial gate stack and an I/O sacrificial gate stack within the logic region, and form a select gate stack and a control gate stack within the memory region;
replacing the polysilicon layer within the logic region with a metal layer to form metal gate electrodes for a high voltage device within the high voltage device region, a core device within the core device region and an I/O device within the I/O device region; and
forming an inter-layer dielectric layer over the polysilicon layer within the memory region and over the metal gate electrodes.

8. The method of claim 7, wherein the gate dielectric has a thickness for the select transistor region and the control transistor region that is smaller than the first thickness.

9. The method of claim 7, wherein the gate dielectric has the third thickness for the select transistor region and the control transistor region.

10. The method of claim 7, further comprising:
forming a sidewall spacer alongside the high voltage sacrificial gate stack, the core sacrificial gate stack, the I/O sacrificial gate stack, the select gate stack and the control gate stack within the memory region;
forming a contact etch stop layer lining the sidewall spacer;
forming a first inter-layer dielectric layer on the contact etch stop layer; and
performing a planarization on the first inter-layer dielectric layer to expose the sidewall spacer and the polysilicon layer.

11. The method of claim 10, wherein sidewalls of the select gate stack and the control gate stack are respectively covered by the sidewall spacer and spaced apart laterally by the contact etch stop layer and the first inter-layer dielectric layer.

12. The method of claim 7, further comprising:
performing a salicidation process to form a silicide layer on upper surfaces of the select gate stack and the control gate stack after replacing the polysilicon layer with the metal layer.

13. A method of forming an integrated circuit (IC), comprising:
forming a memory region comprising a select transistor and a control transistor laterally spaced apart over a substrate, wherein the select transistor and the control transistor are formed by depositing and patterning a polysilicon layer to form a select gate electrode and a control gate electrode arranged over a high-k gate dielectric layer and a memory gate dielectric; and
forming a logic region comprising a logic device by removing the polysilicon layer and replacing with a metal material to form a metal gate electrode disposed over the high-k gate dielectric layer and a logic gate dielectric;
wherein the polysilicon layer remains in the memory region when removed from the logic region;
wherein forming the memory gate dielectric and the logic gate dielectric comprises:
forming and patterning a first oxide layer so that it remains within a first area of the logic region and so that it is removed from remaining areas of the logic region and the memory region; and
forming and patterning a second oxide layer so that it is removed from a second area of the logic region and so that it remains within remaining areas of the logic region and the memory region.

14. The method of claim 13, wherein the control gate electrode of the control transistor and the select gate electrode of the select transistor are formed to have a cuboid shape and upper surfaces aligned with an upper surface of the metal gate electrode.

15. The method of claim 13, wherein the logic gate dielectric is formed to have a thickness greater than a thickness of the memory gate dielectric.

16. The method of claim 13, wherein the memory gate dielectric is formed between the high-k gate dielectric layer and the substrate.

17. The method of claim 13, further comprising:
forming a sidewall spacer having a first portion disposed along sidewalls of the select gate electrode or the control gate electrode, the high-k gate dielectric layer and the memory gate dielectric, and a second portion disposed along sidewalls of the metal gate electrode, the high-k gate dielectric layer and the logic gate dielectric; and
forming a contact etch stop layer between the logic region and the memory region with a 'U' shaped structure;
wherein the 'U' shaped structure has a first vertical component abutting the first portion of the sidewall spacer, a second vertical component abutting the second portion of the sidewall spacer and a planar lateral component connecting the first vertical component and the second vertical component.

18. The method of claim 17, further comprising:
forming source/drain regions within the substrate alongside the metal gate electrode, the select gate electrode and the control gate electrode;
forming a silicide layer on the source/drain regions; and
forming an inter-layer dielectric layer disposed on the contact etch stop layer.

19. The method of claim 17, further comprising:
forming a charge trapping layer over the substrate prior to forming the memory gate dielectric and the control gate electrode, the charge trapping layer is formed by depositing a silicon nitride layer between two silicon dioxide layers;
wherein the charge trapping layer is formed to be vertically aligned with the control gate electrode.

20. The method of claim 13,
wherein the logic gate dielectric is formed by depositing and patterning one or more oxide layers over the substrate.

* * * * *